US010081251B2

(12) United States Patent
Kondou et al.

(10) Patent No.: US 10,081,251 B2
(45) Date of Patent: Sep. 25, 2018

(54) APPARATUS FOR CONTROLLING POWER CONVERTERS

(71) Applicant: DENSO CORPORATION, Kariya, Aichi (JP)

(72) Inventors: Youhei Kondou, Kariya (JP); Yusuke Shindo, Kariya (JP)

(73) Assignee: DENSO CORPORATION, Kariya (JP)

( * ) Notice: Subject to any disclaimer, the term of this patent is extended or adjusted under 35 U.S.C. 154(b) by 145 days.

(21) Appl. No.: 15/218,561

(22) Filed: Jul. 25, 2016

(65) Prior Publication Data

US 2017/0021733 A1    Jan. 26, 2017

(30) Foreign Application Priority Data

Jul. 24, 2015  (JP) ................................. 2015-146478

(51) Int. Cl.
| | |
|---|---|
| B60L 11/08 | (2006.01) |
| H02M 1/08 | (2006.01) |
| H02M 7/5387 | (2007.01) |
| H03K 17/14 | (2006.01) |
| B60L 11/18 | (2006.01) |
| H02M 7/797 | (2006.01) |

(Continued)

(52) U.S. Cl.
CPC ........... *B60L 11/08* (2013.01); *B60L 11/1809* (2013.01); *H02M 1/08* (2013.01); *H02M 7/53871* (2013.01); *H03K 17/145* (2013.01); *H02M 7/797* (2013.01); *H02M 2001/0009* (2013.01); *H02M 2001/0029* (2013.01); *H02M 2001/327* (2013.01)

(58) Field of Classification Search
CPC ............ H02M 1/08; H02M 7/44; H02M 7/48; H02M 7/53871; H02M 7/797; H02M 2001/327; H03K 17/145; B60L 11/08; B60L 11/1809

See application file for complete search history.

(56) References Cited

U.S. PATENT DOCUMENTS

| | | | |
|---|---|---|---|
| 2011/0012542 A1 | 1/2011 | Inamura et al. | |
| 2012/0026771 A1* | 2/2012 | Imura ................... | B60L 3/0015 363/178 |

(Continued)

FOREIGN PATENT DOCUMENTS

| | | |
|---|---|---|
| JP | 2009-055654 A | 3/2009 |
| JP | 2011-024388 A | 2/2011 |
| JP | 2014-161165 A | 9/2014 |

*Primary Examiner* — Levi Gannon
(74) *Attorney, Agent, or Firm* — Oliff PLC

(57) ABSTRACT

In an apparatus for controlling switching operations of switching elements of a power converter to convert input power to output power, a drive controller is configured to generate a drive control instruction indicative of predetermined switching operations of the switching elements, and output the drive control instruction. A driver is configured to drive, in accordance with the drive control instruction, the switching elements, so that the switching elements perform the predetermined switching operations. A switching speed adjuster is configured to obtain at least information indicative of atmospheric pressure, and adjust a switching speed of each of the switching elements such that the switching speed of the corresponding switching element decreases with a decrease of the atmospheric pressure.

8 Claims, 8 Drawing Sheets

(51) Int. Cl.
  *H02M 1/00* (2006.01)
  *H02M 1/32* (2007.01)

(56) References Cited

U.S. PATENT DOCUMENTS

2012/0175948 A1* 7/2012 Kamijo .................. B60L 3/003
                                                    307/9.1
2016/0211767 A1* 7/2016 Hotta ...................... H02M 1/08

* cited by examiner

APPARATUS FOR CONTROLLING POWER CONVERTERS

CROSS REFERENCE TO RELATED APPLICATIONS

This application is based on and claims the benefit of priority from Japanese Patent Application 2015-146478 filed on Jul. 24, 2015, the disclosure of which is incorporated in its entirety herein by reference.

TECHNICAL FIELD

The present disclosure relates to apparatuses for controlling switching operations of switching elements of a power converter.

BACKGROUND

Known technologies, which are preferably applicable to power conversion systems used in environments where atmospheric pressure around the power systems varies, are configured to change the controlling conditions of a power converter of a power conversion system in accordance with the atmospheric pressure around the power conversion system.

For example, Japanese Patent Application Publication No. 2014-161165 discloses a motor vehicle including a control unit for controlling an allowable upper limit voltage for an input voltage to an inverter installed in a motor vehicle. The inverter is an example of power converters for converting direct-current (DC) power to alternating-current (AC) power to be applied to a motor. Specifically, the control unit decreases the allowable upper limit voltage if the motor vehicle is travelling in a low atmospheric-pressure region, such as a high altitude region. This curbs insulation deterioration of the motor, because the atmospheric pressure is proportional to breakdown voltage.

SUMMARY

The above-described Patent Publication refers only to insulation deterioration of the motor under low atmospheric-pressure environments around the motor vehicle.

Typical inverters are each comprised of switching elements, and controlling switching operations of the switching elements of an inverter controls input DC power to produce the desired AC power. This results in a surge resulting from the switching operations being superimposingly applied to the switching elements in addition to an input DC voltage to the switching elements.

Low atmospheric-pressure environments, which reduce spatial electrical insulation properties, may reduce the withstand voltages, i.e. the electrical isolation margins, of electrical isolation devices, which are used together with the inverter, such as transformers or photocouplers, when there is a surge in the switching elements. This may result in an increase of the possibility of electrical breakdown of these electrical isolation devices.

The above-described technology, which merely reduces the allowable upper limit voltage if the motor vehicle is travelling in low atmospheric-pressure environments, may have difficulty in sufficient reduction of the maximum voltage input to the switching elements when there is a surge in the switching elements. This may therefore result in electrical breakdown of the electrical isolation devices that are used together with the inverter. This may therefore require an increase of the electrical isolation distance of each of the electrical isolation devices, resulting in upsizing of each electrical isolation device and circuit board if the electrical isolation devices and the inverter are mounted to a circuit board.

In view of the circumstances set forth above, one aspect of the present disclosure seeks to provide apparatuses for controlling a power converter comprised of a plurality of switching elements. Each of the apparatuses is capable of reducing, despite the reduction in the atmospheric pressure around the apparatus, the maximum voltage input to the power converter even if there is a surge in the switching elements of the power converter.

According to an exemplary aspect of the present disclosure, there is provided an apparatus for controlling switching operations of a plurality of switching elements of a power converter to convert input power to output power. The apparatus includes a drive controller configured to generate a drive control instruction indicative of predetermined switching operations of the switching elements. The apparatus includes a driver configured to drive, in accordance with the drive control instruction, the switching elements, so that the switching elements perform the predetermined switching operations. The apparatus includes a switching speed adjuster configured to obtain at least information indicative of atmospheric pressure, and adjust a switching speed of each of the switching elements such that the switching speed of the corresponding switching element decreases with a decrease of the atmospheric pressure.

The switching speed adjuster of the apparatus according to the exemplary aspect of the present disclosure is configured to adjust the switching speed of each of the switching elements such that the switching speed of the corresponding switching element decreases with a decrease of the atmospheric pressure.

This suppresses the magnitude of a surge even if the surge occurs in low atmospheric-pressure environments in which the withstand voltages, i.e. the electrical isolation margins, of electrical isolation devices used together with the power converter may decrease. This suppression properly prevents electrical breakdown of the electrical isolation devices. This reduces the electrical isolation distance of each of the electrical isolation devices, thus downsizing the apparatus.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
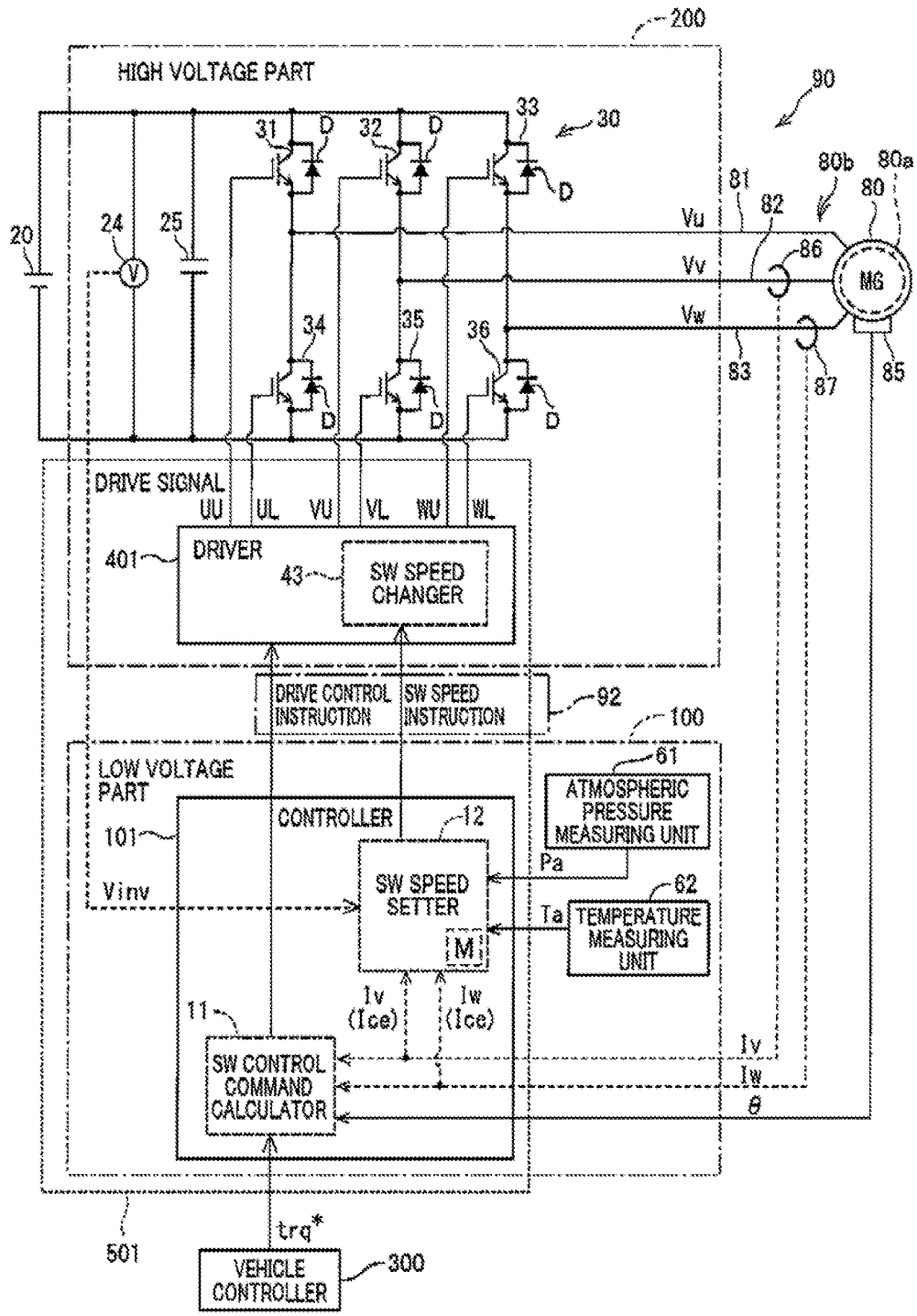
FIG. 1 is a circuit and block diagram of a power conversion system for converting input power to controlled output power according to the first embodiment of the present disclosure.

The following describes the first to third embodiments of the present disclosure with reference to the accompanying drawings. In the first to third embodiments, like parts between the first to third embodiments, to which like reference characters are assigned, are omitted or simplified in description to avoid redundant description.

Power-converter control apparatuses according to the respective first to third embodiments are applicable for power conversion systems installable in hybrid vehicles and/or electrical vehicles. Such a power conversion system drives a motor-generator serving as a power source of the corresponding vehicle. Inverters for converting DC power to AC power serve as, for example, power converters according to the present disclosure, and inverter control apparatuses for controlling switching operations of switching elements of an inverter serve as, for example, power-converter control apparatuses. An input voltage to such an inverter serves as, for example, an input voltage to a power converter.

First Embodiment

The following describes an inverter control apparatus 501 according to the first embodiment with reference to FIGS. 1 to 6.

FIG. 1 schematically illustrates the overall structure of a power conversion system 90 installed in a vehicle, to which the inverter control apparatus 501 has been applied. The power conversion system 90 includes an inverter 30, and causes the inverter 30 to convert DC power output from a battery 20 into desired AC power. The inverter 30 supplies the AC power to a motor-generator 80 serving as one of electrical loads; the motor-generator 80 is illustrated by reference character MG in FIG. 1. Note that, in some figures, the term "switching" is abbreviated by SW.

For example, the motor-generator 80 is a permanent magnet synchronous three-phase motor-generator as an example of rotary electric machines. Specifically, the motor-generator 80 is provided with a rotor 80a and a stator 80b. The rotor 80a is provided with at least one pair of permanent magnets.

The rotor 80a has a direct axis (d-axis) in line with a direction of magnetic flux created by an N pole of the at least one pair of permanent magnets. The rotor 80a also has a quadrature axis (q-axis) with a phase leading by $\pi/2$-radian electrical angle with respect to a corresponding d-axis during rotation of the rotor 80a. In other words, the q-axis is electromagnetically perpendicular to the d-axis. The d and q axes constitute a d-q coordinate system, i.e. a two-phase rotating coordinate system, defined relative to the rotor 80a.

The stator 80b includes a stator core such that the rotor 80a is rotatably arranged with respect to the stator core. The stator 80b also includes a set of three-phase windings, i.e. armature windings, 81, 82, and 83 wound in the stator core. The stator 80b has a three-phase fixed coordinate system having fixed three axes corresponding to the respective three-phase windings 81, 82, and 83.

The three-phase, i.e. U-, V, and W-phase, stator windings 81, 82, and 83 are wound in the stator core such that the U-, V-, and W-phase winding 81, 82, and 83 are shifted by an electrical angle of, for example, $2\pi/3$ radian in phase from each other.

For example, the three-phase armature windings, i.e. U-, V-, and W-phase windings, 81, 82, and 83 each have one end connected to a common junction, i.e. a neutral point, and the other end to a separate terminal in, for example, a star-configuration.

Note that the motor-generator 80 can be designed as a wound-field synchronous motor.

The rotor 80a of the motor-generator 80 is coupled to driving wheels of the vehicle. The motor-generator 80 serves as a motor that generates torque for rotatably driving the driving wheels. The motor-generator 80 also serves as a power generator that regenerates electrical power based on torque supplied from the driving wheels or an internal combustion engine if the internal combustion engine is installed in the vehicle. The generated electrical power is sent to, for example, the battery 20 to charge the battery 20.

The inverter 30 includes switching elements 31 to 36 for converting input DC power to desired AC power to be applied to the motor-generator 80. The control apparatus 501 controls switching operations of the switching elements 31 to 36 to adjust the AC power to be applied to the motor-generator 80.

The battery 20, may be a DC power source, may be for example a chargeable/dischargeable secondary battery, such as a Nickel-metal hydride battery or a Lithium-ion battery. As another example, an electrical double layer capacitor can be used as a DC power source.

The power conversion system 90 includes an input-voltage sensor 24, a smoothing capacitor 25, a rotational angle sensor 85, and current sensors 86 and 87 in addition to the inverter 30.

The input-voltage sensor 24 measures an input voltage Vinv, which is a DC voltage output from the battery 20, to the inverter 30. The input-voltage sensor 24 is communicable with the inverter control apparatus 501, and operative to send, to the inverter control apparatus 501, a measurement signal indicative of the measured input voltage Vinv. The input voltage Vinv to the inverter 30 will be referred to as an inverter input voltage Vinv. The smoothing capacitor 25 smooths the inverter input voltage Vinv, so that the inverter input voltage Vinv, which has been smoothed by the smoothing capacitor 25, is input to the inverter 30.

The separate terminals of the three-phase windings 81, 82, and 83 are coupled to the inverter 30. The inverter 30 is connected to the DC power source 22.

The inverter 30 is designed such that the switching elements 31 to 36 are connected to each other in bridge configuration. Specifically, the switching elements 31, 32, and 33 are respectively U-, V-, and W-phase upper-arm (high-side) switching elements 31, 32, and 33, and the switching elements 34, 35, and 36 are respectively U-, V-, and W-phase lower-arm (low-side) switching elements 34, 35, and 36.

The U-phase upper- and lower-arm switching elements 31 and 34 are connected to each other in series, and the V-phase upper- and lower-arm switching elements 32 and 35 are connected to each other in series. In addition, the W-phase upper- and lower-arm switching elements 33 and 36 are connected to each other in series.

The connection point through which the switching elements 31 and 34 are connected to each other in series is connected to an output lead extending from the separate terminal of the U-phase winding 81. Similarly, the connection point through which the switching elements 32 and 35 are connected to each other in series is connected to an output lead extending from the separate terminal of the V-phase winding 82. The connection point through which the switching elements 33 and 36 are connected to each other in series is connected to an output lead extending from the separate terminal of the W-phase winding 83.

The first embodiment uses IGBTs (Insulated Gate Bipolar Transistors) as the respective switching elements 31 to 36.

The inverter 30 also includes a flywheel diode D connected in antiparallel to each of the switching elements 31 to 36 to permit a current to flow from the emitter side, i.e. low voltage side, to the collector side, i.e. high voltage side. When power MOSFETs, such as N-channel MOSFETs, are used as the switching elements 31 to 36, intrinsic diodes of the power MOSFETs can be used as the flywheel diodes, thus eliminating the need for external flywheel diodes.

The inverter 30 has high-voltage terminals, i.e. collector-side terminals, of the series-connected switching elements. The high-voltage terminals of the inverter 30 are connected to the positive terminal of the battery 20. The inverter 30 also has low-voltage terminals, i.e. emitter-side terminals, of the series-connected switching elements 31 to 36. The low-voltage terminals of the inverter 30 are connected to the negative terminal of the battery 20.

As described above, switching operations of the switching elements 31 to 36 enables DC power output from the battery 20 to be converted into controlled three-phase AC power, so that the controlled three-phase AC power is supplied to the motor-generator 80.

The current sensors 86 and 87 are arranged to measure instantaneous values of V- and W-phase alternating currents Iv and Iw actually flowing through the respective V- and W-phase windings 82 and 83 of the stator 80b. Each of the current sensors 86 and 87 is communicable with the inverter control apparatus 501, and operative to output a measurement signal indicative of the measured value of a corresponding one of the V- and W-phase alternating currents Iv and Iw to the inverter control apparatus 501.

The rotational angle sensor 85 measures a rotational angle, i.e. an electrical rotational angle, θ of the rotor 80a. The rotational angle sensor 85 is communicable with the inverter control apparatus 501, and operative to output, to the inverter control apparatus 501, a measurement signal indicative of the rotational angle θ of the rotor 80a.

The inverter control apparatus 501 includes, for example, a circuit board, a controller 101, and a driver 401; the controller 101 and the driver 401 are mounted to the circuit board. The controller 101 constitutes a low voltage system, so that an operating voltage of, for example, several volts, which is lower than the inverter input voltage Vinv, is applied to the controller 101. In other words, the controller 101 operates based on such a low voltage of several volts when operating. For example, the controller 101 is disposed in a low voltage part 100 defined in the power conversion system 90 of the vehicle.

The controller 101 is designed as, for example, a computer circuit including essentially of, for example, a CPU, a memory including a ROM and a RAM, an input/output (I/O) interface, and buses communicably connecting between the CPU, memory, and I/O interface. The controller 101 is configured such that the CPU runs programs previously stored in the memory to perform various tasks, i.e. routines. If the controller 101 includes at least one dedicated hardware electronic circuit, the at least one dedicated hardware circuit and the CPU are configured to perform the various tasks cooperatively.

For example, a vehicle controller 300, which is a higher-level controller than the controller 101, is configured to perform overall control of the vehicle. Specifically, the vehicle controller 300 is configured to set a request torque trq* based on, for example, the amount of driver's depression of an accelerator pedal of the vehicle, and output a signal indicative of the request torque trq* to the controller 101. This results in the signal indicative of the request torque trq* being input to the controller 101. Additionally, the measurement signals representing the respective V- and W-phase alternating currents Iv and Iw, which are output from the current sensors 86 and 87, and the measurement signal indicative of the rotational angle, i.e. an electrical rotational angle, θ of the rotor 80a, which is output from the rotational angle sensor 85, are input to the controller 101.

The controller 101, which serves as a drive controller, includes a switching control command calculator 11 and a switching speed setter 12. In other words, the CPU and/or the at least one dedicated hardware circuit serve as the switching control command calculator 11 and switching speed setter 12.

The switching control command calculator 11 is configured to perform a known current-feedback control routine based on the request torque trq*, the V- and W-phase alternating currents Iv and w, and the rotational angle θ of the rotor 80a. For example, the known current-feedback control routine calculates the U-phase alternating current Iu based on the V- and W-phase alternating currents Iv and Iw in accordance with the Kirchhoff's law, and converts the three-phase currents Iu, Iv, and Iw into d- and q-axis currents Id and Iq. The known current-feedback control routine sets a d-axis command current Id* and a q-axis command current Iq* based on the request torque trq*, and calculates a d-axis deviation ΔId between the d-axis command current Id* and the d-axis current Id, and a q-axis deviation ΔIq between the q-axis command current Iq* and the q-axis current Iq.

Then, the known current-feedback control routine performs, for example, a proportional-integral feedback task. The proportional-feedback task calculates a d-axis command voltage Vd* such that the d-axis deviation ΔId converges to zero, thus causing the d-axis current Id to follow the d-axis command current Id*. Similarly, the proportional-feedback task also calculates a q-axis command voltage Vq* such that the q-axis deviation ΔIq converges to zero, thus causing the q-axis current Iq to follow the q-axis command current Iq*. After calculation of the d- and q-axis command voltages Vd* and Vq*, the known current-feedback control routine converts the d- and q-axis command voltages Vd* and Vq* into three-phase command voltages Vu*, Vv*, and Vw* in the three-phase fixed coordinate system.

For example, the known current-feedback control routine compares in magnitude each of the three-phase command voltages Vu*, Vv*, and Vw* with a periodic carrier signal, such as a periodic triangular carrier signal. Then, the known current-feedback control routine generates drive control instructions in accordance with the results of the comparison between the three-phase command voltages Vu*, Vv*, and Vw* and the periodic carrier signal, and outputs the drive control instructions to the driver 401.

The inverter 30 constitutes a high voltage system, so that the inverter 30 is disposed in a high voltage part 200 defined in the power conversion system 90 of the vehicle; in the high voltage part, a high voltage, which lies within the range from tens of volts to hundreds of volts, is applied to the inverter 30.

The driver 401 also constitutes the high voltage system. The diver 401 generates, based on the drive control instructions, drive signals UU, VU, WU, UL, VL, and WL for the respective switching elements 31, 32, 33, 34, 35, and 36. That is the drive signals UU, VU, WU, UL, VL, and WL are pulse-width modulated (PWM) signals based on the results of the so comparison between the three-phase command voltages Vu*, Vv*, and Vw* and the periodic carrier signal.

The driver 401 outputs the drive signals UU and UL that complementarily turn on the upper- and lower-arm switching elements 31 and 34. Similarly, the driver 401 outputs the drive signals VU and VL that complementarily turn on the upper- and lower-arm switching elements 32 and 35. Additionally, the driver 401 outputs the drive signals WU and WL that complementarily turn on the upper- and lower-arm switching elements 33 and 36.

The power conversion system 90 includes electrical isolation elements 92, such as transformers or photocouplers, which are not shown, mounted on the circuit board of the inverter control apparatus 501. The electrical isolation elements 92 establish electrical isolation between the elements disposed in the low voltage part 100 and the elements disposed in the high voltage part 200.

The driver 401 also includes a general switching speed changer 43 capable of changing the switching speed of each of the switching elements 31 to 36.

Note that switching a typical switching element, such as an IGBT, from one of an on state and an off state to the other thereof causes a surge to occur due to a rapid change of a current flowing through the typical switching element. The rapid change of the current flowing through the typical switching element is generated at the switching timing. That is, the magnitude of the surge is proportional to the differential value of the current flowing through the typical switching element Slowing the switching speed of a switching element is therefore effective in reduction of adverse effects of such a surge.

However, constantly slowing the switching speed of a switching element may increase switching loss of the switching element. Users therefore have a requirement to 1. Decrease the switching speed of a switching element to suppress the magnitude of a surge under the situations where there is a higher need to reduce adverse effects generated by the corresponding switching operation 2. Increase the switching speed under the situations where there is a lower need to reduce adverse effects generated by the corresponding switching operation, thus reducing switching loss of the switching element.

To fulfill the user's requirements, the switching speed changer 43 is configured to change the switching speed of each of the switching elements 31 to 36 in response to switching-speed instructions sent from the switching speed setter 12. How the switching speed setter 12 and the switching speed changer 43 specifically operate will be described later.

Additionally, the power conversion system 90 includes an atmospheric-pressure measuring unit 61 for measuring atmospheric pressure Pa, and a temperature measuring unit 62 for measuring environment temperature Ta therearound. The atmospheric-pressure measuring unit 61 and temperature measuring unit 62 are provided in the low voltage part 100.

For example, the atmospheric-pressure measuring unit 61 includes a pressure sensor comprised of a pressure-sensitive element. The reference character Pa is merely a label and does not mean pascal as the unit of pressure. The present disclosure uses atmospheres (atm) the unit of atmospheric pressure (see FIGS. 3 and 5).

The switching speed setter 12, which is installed in the controller 101 according to the first embodiment, obtains a value of at least one parameter correlating with the switching speed of each of the switching elements 31 to 36 from the corresponding at least one of the components 61, 62, 86, 87, and 24.

Specifically, the switching speed setter 12 obtains a value of the atmospheric pressure Pa from the atmospheric-pressure measuring unit 61. The switching speed setter 12 also obtains values of the V- and W-phase alternating currents Iv and Iw sent from the respective current sensors 86 and 87. The switching speed setter 12 further obtains a value of the environment temperature Ta from the temperature measuring unit 62, and a value of the inverter input voltage Vinv from the measurement signal sent from the input-voltage sensor 24. Note that the atmospheric-pressure measuring unit 61 and the temperature measuring unit 62 can be provided outside the circuit board of the controller 101 as illustrated in FIG. 1, or can be provided to the circuit board of the controller 101.

The switching speed setter 12 can obtain only a value of the atmospheric pressure Pa from the atmospheric-pressure measuring unit 61. The switching speed setter 12 can also obtain at least one of a value of the V-phase alternating current Iv, a value of the W-phase alternating current Iw, a value of the environment temperature Ta, and a value of the inverter input voltage Vinv in addition to a value of the atmospheric pressure Pa.

That is, the switching speed setter 12 manipulates the V-phase alternating current Iv or the W-phase alternating current Iw as a current reflecting a switching-element current Ice, i.e. a collector-emitter current Ice, flowing between the collector and emitter of the corresponding phase switching element. The switching speed setter 12 can calculate the U-phase alternating current Iu based on the V- and W-phase alternating currents Iv and Iw in accordance with the Kirchhoff's law.

Figure 2:
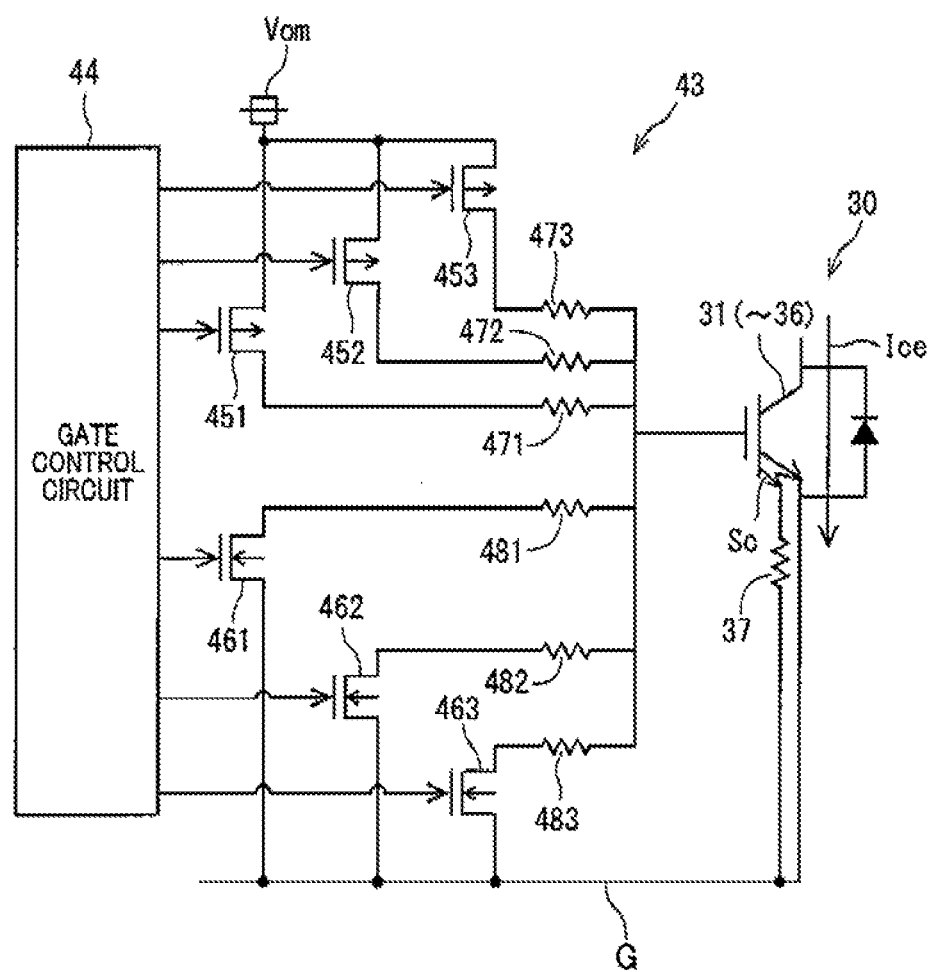
FIG. 2 is a circuit diagram schematically illustrating an overall structure of a switching speed changer illustrated in FIG. 1.

Note that each of the switching elements 31 to 36 can have a sense cell, i.e. sense terminal, Sc, and the switching speed setter 12 can obtain a value of the switching-element current Ice of each of the switching elements 31 to 36 from the corresponding sense cell Sc (sec FIG. 2). Specifically, the sense terminal Sc of each of the switching elements 31 to 36 is connected to a common ground G of the inverter 30 via a sense resistor 37, and the emitter of each of the switching elements 31 to 36 is connected to the common ground G. Thus, the switching speed setter 12 can measure the voltage across the sense resistor 37 of each of the switching elements 31 to 36 to obtain, based on the measured voltage, a value of the switching-element current Ice flowing through the corresponding switching element.

That is, the sense cells Sc provided to the respective upper- and lower-arm switching elements of each phase enable the switching speed setter 12 to measure a short-circuit current flowing through the upper- and lower-arm switching elements.

The switching speed setter 12 sets the switching speed of each of the switching elements 31 to 36 based on the value of the at least one parameter set forth above. Then, the switching speed setter 12 sends, to the switching speed changer 43, the switching-speed instructions indicative of the switching speed of each of the switching elements 31 to 36 set thereby. Specifically, the switching speed setter 12, which is disposed in the low voltage part 100, outputs the switching speed instructions to the switching speed changer 43, which is disposed in the high voltage part 200, via the electrical isolation elements 92 while establishing electrical isolation between the switching speed setter 12 and the switching speed changer 43.

The switching speed changer 43 changes the switching speed of each of the switching elements 31 to 36 based on the switching speed instructions sent from the switching speed setter 12.

That is, the switching speed setter 12 and the switching speed changer 43 serves as, for example, a switching speed adjuster. The switching speed adjuster is configured to obtain at least information indicative of the atmospheric pressure Pa around the apparatus 501, and adjust the switching speed of each switching element 31 to 36 such that the switching speed of the corresponding switching element decreases with a decrease of the atmospheric pressure Pa described in detail later.

Next, the following describes an example of the structure of the switching speed changer 43 with reference to FIG. 2.

The switching speed changer 43 according to the first embodiment stepwisely changes the gate voltage or gate resistance of each switching element 31 to 36. FIG. 2 illustrates that the switching speed changer 43 uses a constant voltage to change the gate resistance of each switching element 31 to 36 at three levels accordingly in a constant voltage mode. The switching speed changer 43 can change the switching speed of each switching element 31 to 36 using a constant current in a constant current mode. In this modification, the switching speed changer 43 can continuously, i.e. non-stepwisely, change the switching speed of each switching element 31 to 36.

Referring to FIG. 2, the switching speed changer 43 includes, for each switching element 31 to 36, a gate control circuit 44, a plurality of, such as three, turn-on switching elements 451, 452, and 453, and a plurality of, such as three, turn-on resistors 471, 472, and 473. The switching speed changer 43 also includes a plurality of, such as three, turn-off switching elements 461, 462, and 463, and a plurality of, such as three, turn-off resistors 481, 482, and 483. FIG. 2 schematically illustrates the module of the circuits 451, 452, 453, 471, 472, 473, 461, 462, 463, 481, 482, and 483 for the switching element 31, so that the other modules respectively provided for the other switching elements 32 to 36 can be provided in the switching speed changer 43. The gate control circuit 44 can be commonly used for controlling the switching speeds of all the switching elements 31 to 36.

As described above, the upper- and lower-arm switching elements of each phase need be complementarily turned on. Thus, the switching speed changer 43 is configured to set the turn-on speed of the upper-arm switching element and the turn-off speed of the lower-arm switching element of each phase such that the turn-on speed of the upper-arm switching element and the turn-off speed of the lower-arm switching element substantially match with each other. Similarly, the switching speed changer 43 is configured to set the turn-off speed of the upper-arm switching element and the turn-on speed of the lower-arm switching element of each phase such that the turn-off speed of the upper-arm switching element and the turn-on speed of the lower-arm switching element substantially match with each other. The turn-on speed of the upper-arm switching element does not so strictly match with the turn-off speed of the lower-arm switching element as long as there are no adverse effects. Similarly, the turn-off speed of the upper-arm switching element does not so strictly match with the turn-on speed of the lower-arm switching element as long as there are no adverse effects.

The first embodiment uses P-channel FETs as the respective turn-on switching elements 451, 452, and 453. Each of the turn-on FETs 451, 452, and 453 has an input terminal, such as its source, connected to an isolated power supply 310, so that a constant reference voltage Vom is applied from the isolated power supply 310 to the input terminal of the input terminal of each of the turn-on FETs 451, 452, and 453. Each of the turn-on FETs 451, 452, and 453 also has an output terminal, such as its drain, connected to a first end of a corresponding one of the turn-on resistors 471, 472, and 473. Each of the turn-on resistors 471, 472, and 473 has a second end, which is opposite to the first end, connected to the gate of the switching element 31.

Each of the turn-on resistors 471, 472, and 473 also has a control terminal, i.e. its gate, connected to the gate control circuit 44. The turn-on resistors 471, 472, and 473 have resistance values, which are different from each other.

The gate control circuit 44 sends a gate signal to a selected one of the turn-on FETs 451, 452, and 453 to switch on the selected one of the turn-on FETs 451, 452, and 453. This enables a charging current based on the constant reference voltage Vom to be supplied to the gate of the switching element 31 via an electrical conduction path, on which the corresponding turn-on resistor is mounted, between the constant reference voltage Vom and the gate of the switching element 31. This charges the gate of the switching element 31 to increase the gate voltage of the switching element 31, so that, when the gate voltage becomes equal to or higher than a first threshold voltage, the switching element 31 is turned on.

The turn-on resistors 471, 472, and 473, which are different from each other, therefore enable the charging speed of the gate of the switching element 31 to be stepwisely changed, so that the switching speed, i.e. turn-on speed, of the switching element 31 is stepwisely changed.

The first embodiment uses N-channel FETs as the respective turn-off switching elements 461, 462, and 463. Each of the turn-off FETs 461, 462, and 463 has an input terminal, such as its drain, connected to a first end of a corresponding one of the turn-off resistors 481, 482, and 483. Each of the turn-on resistors 481, 482, and 483 has a second end, which is opposite to the first end, connected to the gate of the switching element 31.

Each of the turn-off FETs 461, 462, and 463 has an output terminal, such as its source, connected to the common ground G.

Each of the turn-off FETs 461, 462, and 463 has a control terminal, i.e. its gate, connected to the gate control circuit 44. The turn-off resistors 481, 482, and 483 have resistance values, which are, for example, different from each other.

The gate control circuit 44 sends a gate signal to a selected one of the turn-off FET 461, 462, and 463 to switch on the selected one of the turn-off FETs 461, 462, and 463. This enables a discharging current to flow from the gate of the switching element 31 via an electrical conduction path, on which the corresponding turn-off resistor is mounted, between the gate of the switching element 31 and the common ground G. This discharges the gate of the switching element 31 to decrease the gate voltage of the switching element 31, so that, when the gate voltage becomes equal to or lower than a second threshold voltage, the switching element 31 is turned off.

The turn-off resistors 481, 482, and 483, which are different from each other, therefore enable the discharging speed of the gate of the switching element 31 to be stepwisely changed, so that the switching speed, i.e. turn-off speed, of the switching element 31 is stepwisely changed.

The circuit structure and operations of each of the other modules respectively provided for the other switching elements 32 to 36 are substantially identical to the circuit structure and operations of the module provided for the switching element 31.

Next, the following describes the first to third specific switching-speed changing patterns, which are examples of various switching-speed changing patterns for the switching element 31 selected as a typical example of the switching elements 31 to 36 with reference to FIGS. 3A to 5.

Figure 3A:
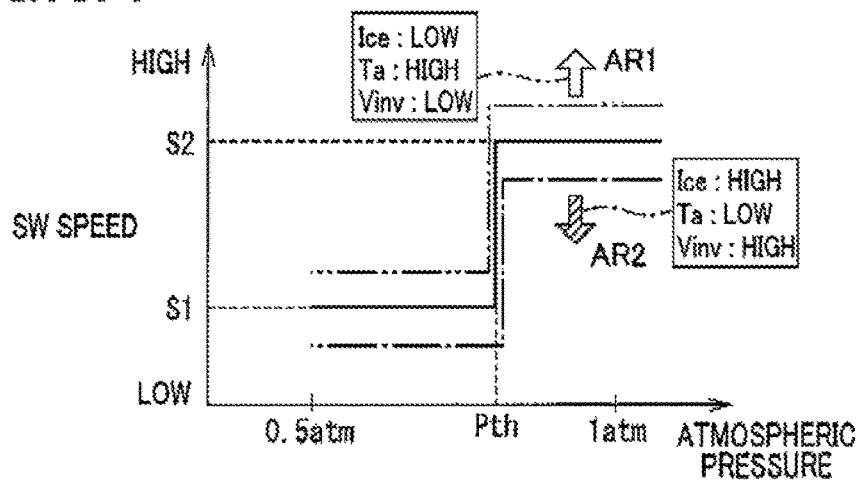
FIG. 3A is a graph schematically illustrating that an inverter control apparatus illustrated in FIG. 1 changes the switching speed of a switching element in two levels in accordance with atmospheric pressure.
Figure 3B:
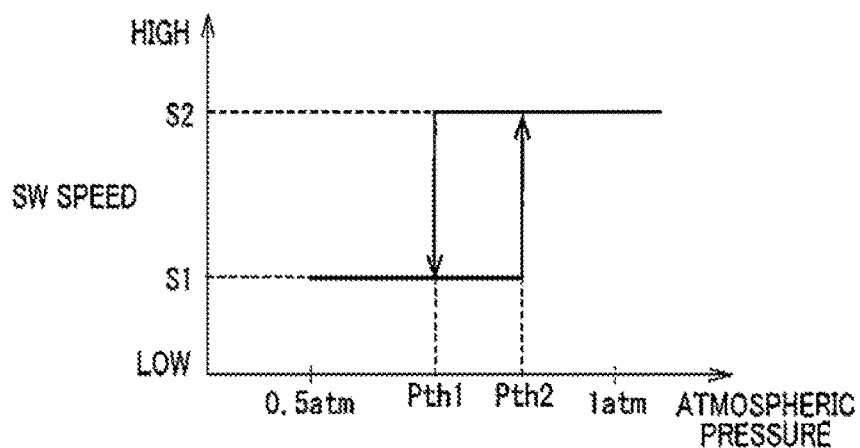
FIG. 3B is a graph schematically illustrating that the inverter control apparatus changes the switching speed of a switching element in a hysteresis curve indicative of the relationships between the switching speed and the atmospheric pressure.

FIG. 3A schematically illustrates that the inverter control apparatus 501 changes the switching speed of the switching element 31 in two levels in accordance with the atmospheric pressure Pa. Specifically, the inverter control apparatus 501 sets the switching speed of the switching element 31 to (1) A first speed SP1 when the atmospheric pressure Pa is lower than a threshold pressure Pth (2) A second speed SP2, which is higher than the first speed SP1, when the atmospheric pressure Pa is equal to or higher than the threshold pressure Pth.

Specifically, motoring roads, i.e. motorways, at the fifth station of Mount Fuji in Japan are approximately 2400 m above sea level, and have an atmospheric pressure of approximately 0.75 atmospheres. On the other hand, there are paved roads in Colorado in the United States where the paved roads are 4000 m or more over sea level, and are at an atmospheric pressure of approximately 0.6 atmospheres. Thus, setting the threshold pressure Pth to 0.8 atmospheres enables the switching speed of the switching element 31 to be changed from the second speed SP2 to the first speed SP1 while the vehicle is moving from a non-mountainous road at 1 atmosphere to a mountainous road which is 2000 m or more above sea level.

A decrease of the atmospheric pressure Pa may reduce spatial electrical insulation properties. This may reduce the withstand voltages, i.e. the electrical isolation margins, of electrical isolation devices, such as transformers or photocouplers, when there is a surge in a switching element. This may result in an increase of the possibility of electrical breakdown of these electrical isolation devices.

In view of these circumstances, the inverter control apparatus 501 is configured to reduce the switching speed of each of the switching elements 31 to 36 in low atmospheric-pressure environments in which the withstand voltages, i.e. the electrical isolation margins, of electrical isolation devices may decrease. This suppresses the magnitude of a surge even if the surge occurs, thus preventing electrical breakdown of the electrical isolation elements 92 mounted to the circuit board of the inverter control apparatus 501.

Figure 6:
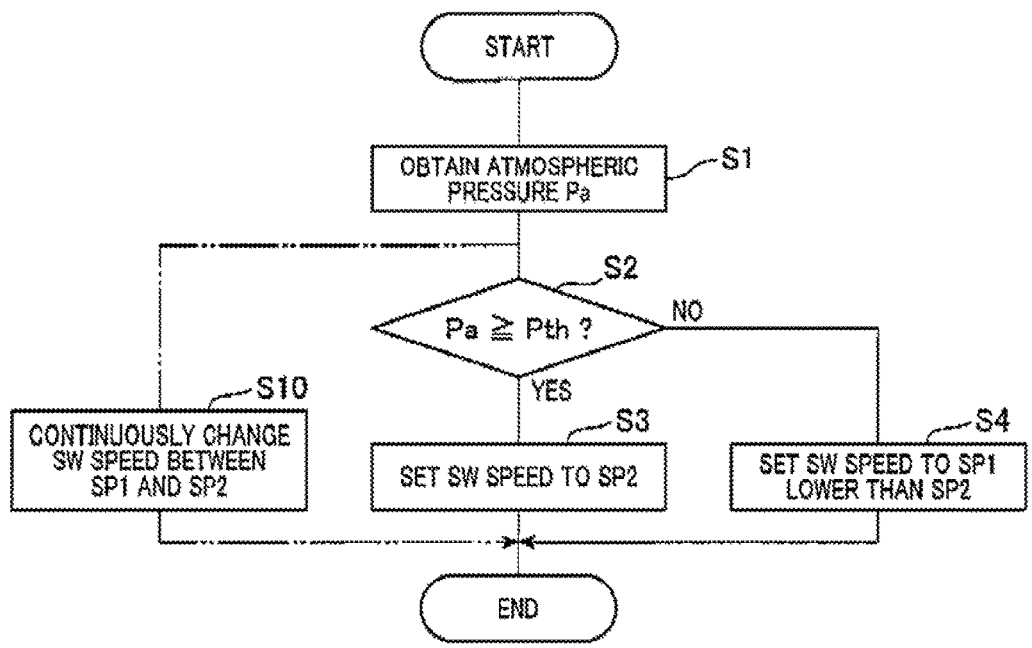
FIG. 6 is a flowchart schematically illustrating a switching speed setting routine executed by the inverter control apparatus illustrated in FIG. 1.

FIG. 6 is a flowchart schematically illustrating a switching speed setting routine, which is for example periodically executed by the inverter control apparatus 501. The switching speed setting routine illustrated in FIG. 6 causes the inverter control apparatus 501 to change the switching speed of the switching element 31 in two levels in accordance with the atmospheric pressure Pa as illustrated in FIG. 3A.

Note that, while the vehicle is travelling from a present place toward a target place whose attitude above sea level is higher than that of the present place, the atmospheric pressure Pa does not change sharply. The execution period of the switching speed setting routine can be therefore set to be longer than the normal control period of the controller 101.

When launching the switching speed setting routine, the switching speed setter 12 of the inverter control apparatus 501 obtains the atmospheric pressure Pa from the atmospheric-pressure measuring unit 61 in step S1. Next, the switching speed setter 12 determines whether the atmospheric pressure Pa is equal to or higher than the threshold pressure Pth in step S2.

Upon determining that the atmospheric pressure Pa is equal to or higher than the threshold pressure Pth (YES in step S2), the switching speed setter 12 sets the switching speed of the switching element 31 to the second speed SP2 in step S3. Otherwise, upon determining that the atmospheric pressure Pa is lower than the threshold pressure Pth (NO in step S2), the switching speed setter 12 sets the switching speed of the switching element 31 to the first speed SP1 in step S4. Thereafter, the inverter control apparatus 501 terminates the switching speed setting routine.

The switching speed setting routine illustrated in FIG. 3A is designed to use the atmospheric pressure Pa as the at least one parameter. The switching speed setting routine illustrated in FIG. 3A can be designed to use at least one of the switching-element current Ice, the environment temperature Ta, and the inverter input voltage Vinv in addition to the atmospheric pressure Pa as the at least one parameter. In this modification, each of the first and second speeds S1 and S2 in the switching speed setting routine is shifted into the higher side or lower side in accordance with the value of at least one of the switching-element current Ice, the environment temperature Ta, and the inverter input voltage Vinv.

Figure 4A:
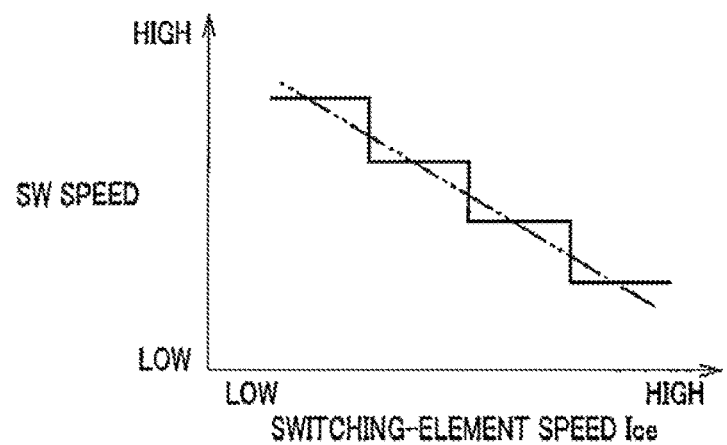
FIG. 4A is a graph schematically illustrating the relationships between the switching speed of a switching element and a switching-element current according to the first embodiment.
Figure 4B:
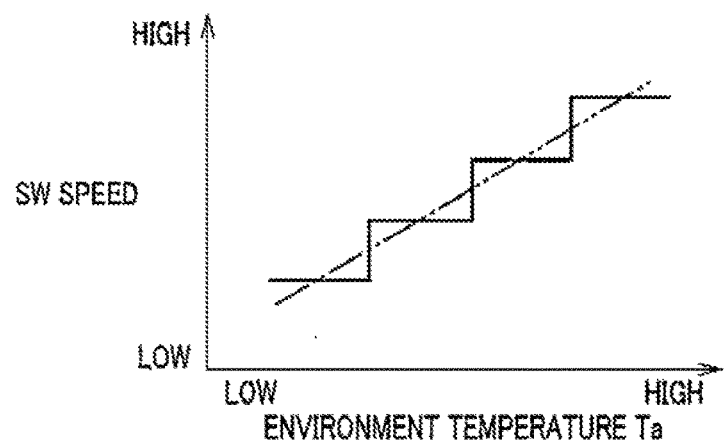
FIG. 4B is a graph schematically illustrating the relationships between the switching speed of a switching element and an environmental temperature according to the first embodiment.
Figure 4C:
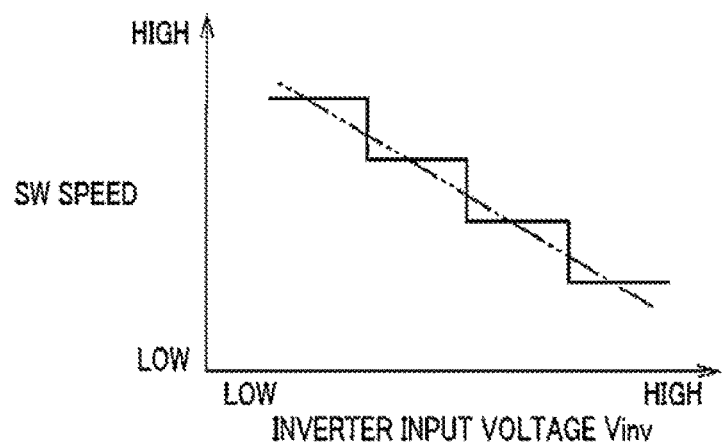
FIG. 4C is a graph schematically illustrating the relationships between the switching speed of a switching element and an inverter input voltage according to the first embodiment.

FIG. 4A illustrates the relationships between the switching speed of the switching element 31 and the switching-element current Ice, and FIG. 4B illustrates the relationships between the switching speed of the switching element 31 and the environment temperature Ta. FIG. 4C illustrates the relationships between the switching speed of the switching element 31 and the inverter input voltage Vinv.

An increase of the switching-element current Ice flowing through the switching element 31 increases the magnitude of a surge occurring at the turn-off of the switching element 31, so that the withstand voltages, i.e. the electrical isolation margins, of the electrical isolation elements 92 decrease. The switching speed setter 12 therefore sets the switching speed of the switching element 31 such that, the higher the magnitude of the switching-element current Ice is, the lower the switching speed of the switching element 31 is (see FIG. 4A). The switching speed setter 12 can continuously or stepwisely decrease the switching speed of the switching element 31 with an increase of the switching-element current Ice (see FIG. 4A).

A decrease of the environment temperature Ta increases the magnitude of a surge occurring at the switching operation of the switching element 31, so that the withstand voltages, i.e. the electrical isolation margins, of the electrical isolation elements 92 decrease. The switching speed setter 12 therefore sets the switching speed of the switching element 31 such that, the lower the environment temperature Ta is, the lower the switching speed of the switching element 31 is (see FIG. 4B). The switching speed setter 12 can continuously or stepwisely increase the switching speed of the switching element 31 with an increase of the environment temperature Ta (see FIG. 4B).

An increase of the inverter input voltage Vinv increases the magnitude of a surge occurring at the switching operation of the switching element 31, resulting in an increase of the maximum voltage to be applied to the switching element 31. This results in a decrease of the withstand voltages, i.e. the electrical isolation margins, of the electrical isolation elements 92. The switching speed setter 12 therefore sets the switching speed of the switching element 31 such that, the higher the magnitude of the inverter input voltage Vinv is, the lower the switching speed of the switching element 31 is (see FIG. 4C). The switching speed setter 12 can continuously or stepwisely decrease the switching speed of the switching element 31 with an increase of the inverter input voltage Vinv (see FIG. 4C).

That is, as illustrated in FIG. 3A, each of the first and second speeds S1 and S2 in the switching speed setting routine is shifted into the higher side (see an open arrow AR1 in FIG. 3A) when at least one of the following conditions is satisfied:

The first condition is that a present value of the switching-element current Ice obtained at the present execution cycle of the switching speed setting routine becomes lower than a first previous value of the switching-element current Ice obtained at the first previous execution cycle of the switching speed setting routine.

The second condition is that a present value of the environment temperature Ta obtained at the present execution cycle of the switching speed setting routine becomes higher than a first previous value of the environment temperature Ta obtained at the first previous execution cycle of the switching speed setting routine.

The third condition is that a present value of the inverter input voltage Vinv obtained at the present execution cycle of the switching speed setting routine becomes lower than a first previous value of the inverter input voltage Vinv obtained at the first previous execution cycle of the switching speed setting routine.

Each of the first and second speeds S1 and S2 in the switching speed setting routine is shifted into the lower side (see a hatched arrow AR2 in FIG. 3A) when at least one of the following conditions is satisfied:

The fourth condition is that a present value of the switching-element current Ice obtained at the present execution cycle of the switching speed setting routine becomes higher than a first previous value of the switching-element current Ice obtained at the first previous execution cycle of the switching speed setting routine.

The fifth condition is that a present value of the environment temperature Ta obtained at the present execution cycle of the switching speed setting routine becomes lower than a first previous value of the environment temperature Ta obtained at the first previous execution cycle of the switching speed setting routine.

The sixth condition is that a present value of the inverter input voltage Vinv obtained at the present execution cycle of the switching speed setting routine becomes higher than a first previous value of the inverter input voltage Vinv obtained at the first previous execution cycle of the switching speed setting routine.

In step S2, the switching speed setter 12 for example determines whether the atmospheric pressure Pa decreases down to a first threshold pressure Pth1. Upon determining that the atmospheric pressure Pa decreases down to the first threshold pressure Pth1, the switching speed setter 12 performs the operation in step S4 to switch the switching speed of the switching element 31 from the first speed SP1 to the second speed SP2 (see FIG. 3B).

In step S2, the switching speed setter 12 also determines whether the atmospheric pressure Pa increases up to a second threshold pressure Pth2, which is higher than the first threshold pressure Pth1. Upon determining that the atmospheric pressure Pa increases up to the second threshold pressure Pth2, the switching speed setter 12 performs the operation in step S3 to switch the switching speed of the switching element 31 from the first speed SP1 to the second speed SP2 (see FIG. 3B).

That is, the relationships between the switching speed of the so switching element 31 and the atmospheric pressure Pa have hysteresis characteristics. For example, the switching speed of the switching element 31 is kept at the first speed SP1 while the atmospheric pressure Pa is lower than the second threshold pressure Pth2 even if the atmospheric pressure Pa becomes equal to or higher than the first threshold pressure Pth1. In addition, the switching speed of the switching element 31 is kept at the second speed SP2 while the atmospheric pressure Pa is equal to or higher than the first threshold pressure Pth1 even if the atmospheric pressure Pa becomes lower than the second threshold pressure Pth2. Thus, even if the atmospheric pressure Pa is frequently changed around the first threshold pressure Pth1 or the second threshold pressure Pth2, this modification illustrated in FIG. 3B prevents the switching speed of the switching element 31 from being frequently switched.

This prevents hunting of the switching speed of the switching element 31 between the first speed SP1 and the second speed SP2, thus preventing the switching speed control of the switching element 21 from being unstable.

Figure 3C:
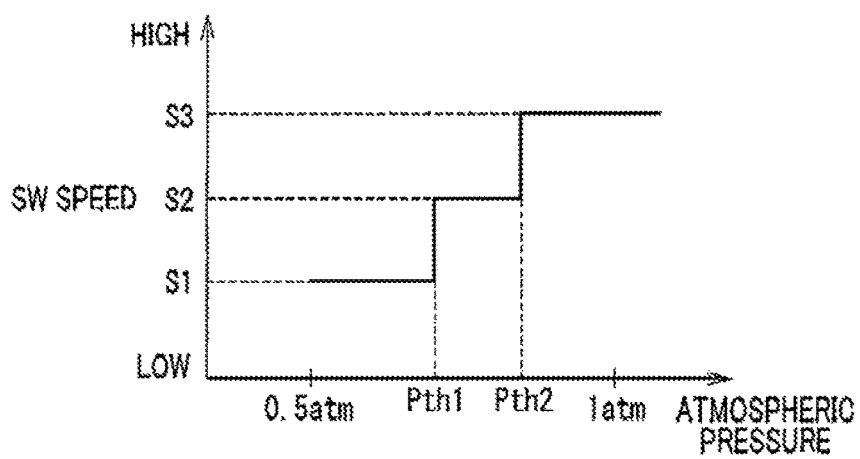
FIG. 3C is a graph schematically illustrating that the inverter control apparatus stepwisely changes the switching speed of a switching element in accordance with the atmospheric pressure.

In step S2, the switching speed setter 12 determines whether the atmospheric pressure Pa is equal to or higher than the first threshold pressure Pth1 and lower than the second threshold Pth2 (see FIG. 3C).

Upon determining that the atmospheric pressure Pa is equal to or higher than the first threshold pressure Pth1 and lower than the second threshold Pth2 (YES in step S2), the switching speed setter 12 sets the switching speed of the switching element 31 to the second speed SP2 in step S3. Otherwise, upon determining that the atmospheric pressure Pa is lower than the first threshold pressure Pth1 (NO in step S2), the switching speed setter 12 keeps the switching speed of the switching element 31 to the first speed SP1.

In addition, in step S2, the switching speed setter 12 determines whether the atmospheric pressure Pa is equal to or higher than the second threshold Pth2 (see FIG. 3C).

Upon determining that the atmospheric pressure Pa is equal to or higher than the second threshold Pth2, the switching speed setter 12 sets the switching speed of the switching element 31 to a third speed SP3 higher than the second speed SP2 in step S3. Otherwise, upon determining that the atmospheric pressure Pa is lower than the second threshold pressure Pth2 (NO in step S2), the switching speed setter 12 determines whether the atmospheric pressure Pa is equal to or higher than the first threshold Pth1 (see FIG. 3C) in step S2.

Upon determining that the atmospheric pressure Pa is equal to or higher than the first threshold Pth1 (see FIG. 3C) in step S2, the switching speed setter 12 sets the switching speed of the switching element 31 to the second speed SP2 in step S3.

Otherwise, upon determining that the atmospheric pressure Pa is lower than the first threshold Pth1 (see FIG. 3C) in step S2, the switching speed setter 12 sets the switching speed of the switching element 31 to the first speed SP1 in step S4.

That is, the switching speed setter 12 sets the switching speed of the switching element 31 to any one of the first, second, and third speeds.

Figure 5:
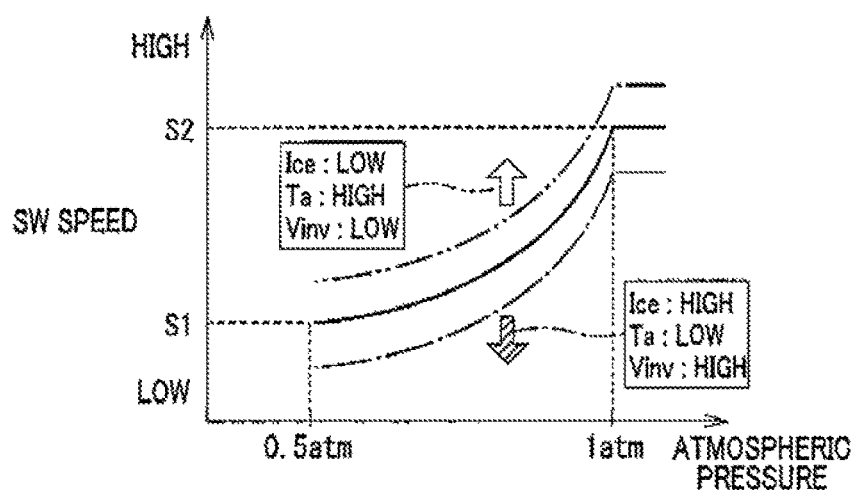
FIG. 5 is a graph schematically illustrating that the inverter control apparatus continuously changes the switching speed of a switching element in accordance with the atmospheric pressure.

As illustrated in FIG. 5, after the operation in step S1, the switching speed setter 12 can continuously change the switching speed of the switching element 31 between the first speed SP1 and the second speed SP2 inclusive with change of the atmospheric pressure Pa between 0.5 and 1.0 atmospheres inclusive in step S10 (see FIG. 6). For example, as illustrated in FIG. 5, the switching speed setter 12 can continuously change the switching speed of the switching element 31 from the first speed SP1 to the second speed SP2 inclusive in a concavely upward curve. The switching speed setter 12 can continuously change the switching speed of the switching element 31 from the first speed SP1 to the second speed SP2 inclusive in a linear fashion, a convexly upward curve, or another shaped curve.

In this modification illustrated in FIGS. 5 and 6, the curve or linear function indicative of the relationships between the atmospheric pressure Pa and the switching speed of the switching element 31 is shifted into the higher side (see an open arrow AR3 in FIG. 5) when at least one of the following conditions is satisfied:

The first condition is that a present value of the switching-element current Ice obtained at the present execution cycle of the switching speed setting routine becomes lower than a most recent previous value of the switching-element current Ice obtained at the most recent previous execution cycle of the switching speed setting routine.

The second condition is that a present value of the environment temperature Ta obtained at the present execution cycle of the switching speed setting routine becomes higher than a most recent previous value of the environment temperature Ta obtained at the most recent previous execution cycle of the switching speed setting routine.

The third condition is that a present value of the inverter input voltage Vinv obtained at the present execution cycle of the switching speed setting routine becomes lower than a most recent previous value of the inverter input voltage Vinv obtained at the most recent previous execution cycle of the switching speed setting routine.

The curve or linear indicative of the relationships between the atmospheric pressure Pa and the switching speed of the switching element 31 is shifted into the lower side (see an open arrow AR4 in FIG. 5) when at least one of the following conditions is satisfied:

The fourth condition is that a present value of the switching-element current Ice obtained at the present execution cycle of the switching speed setting routine becomes higher than a most recent previous value of the switching-element current Ice obtained at the most recent previous execution cycle of the switching speed setting routine.

The fifth condition is that a present value of the environment temperature Ta obtained at the present execution cycle of the switching speed setting routine becomes lower than a first most recent value of the environment temperature Ta obtained at the first most recent execution cycle of the switching speed setting routine.

The sixth condition is that a present value of the inverter input voltage Vinv obtained at the present execution cycle of the switching speed setting routine becomes higher than a most recent previous value of the inverter input voltage Vinv obtained at the most recent previous execution cycle of the switching speed setting routine.

More specifically, the switching speed setter 12 includes, for example, information, i.e. correlation information, M in the form of, for example, maps or equations; the information M represents at least one of the relationships, which are illustrated in FIGS. 3A to 3C and 5, between the atmospheric pressure Pa and the switching speed of the switching element 31.

Specifically, the switching speed setter 12 can select one of the relationships, which are illustrated in FIGS. 3A to 3C and 5, between the atmospheric pressure Pa and the switching speed of the switching element 31. Then, the switching speed setter 12 can change the switching speed of the switching element 31 based on the selected relationship between the atmospheric pressure Pa and the switching speed of the switching element 31. This enables the switching speed setter 12 to reliably and simply change the switching speed of the switching element 31.

Additionally, the switching speed setter 12 can adjust the selected information in consideration of (1) The switching speed of the switching element 31 decreasing with an increase of the switching-element current Ice;

(2) The switching speed of the switching element 31 decreasing with an increase of the input voltage (3) The switching speed of the corresponding switching element decreasing with an increase of the input voltage.

The first to third specific switching-speed changing patterns can be applied to the other switching elements 32 to 36 in the same approach as those applied to the switching element 31 set forth above.

The above-configured inverter control apparatus 501 includes the switching speed setter 12. The switching speed setter 12 obtains information indicative of the atmospheric pressure Pa from the atmospheric-pressure measuring unit 61.

Then, the switching speed setter 12 sets the switching speed of each of the switching elements 31 to 36 such that, the lower the atmospheric pressure Pa is, the lower the switching speed of each of the switching elements 31 to 36 is. This suppresses the magnitude of a surge even if the surge occurs in low atmospheric-pressure environments in which the withstand voltages, i.e. the electrical isolation margins, of the electrical isolation elements 92 may decrease. This reduces the maximum voltage generated between the low voltage part 100 and the high voltage part 200, thus properly preventing electrical breakdown of the electrical isolation elements 92 mounted to the circuit board of the inverter control apparatus 501. This reduces the electrical isolation distance of each of the electrical isolation elements 92 mounted to the circuit board of the inverter control apparatus 501, thus downsizing the circuit board of the inverter control apparatus 501.

Reducing the switching speed of each of the switching elements 31 to 36 may increase switching loss of the corresponding switching element. In view of this point, the switching speed setter 12 sets the switching speed of each of the switching elements 31 to 36 to a higher speed if the atmospheric pressure Pa changes from a present value to a sufficient higher value. This is because the higher the atmospheric pressure Pa is, the higher the withstand voltages, i.e. the electrical isolation margins, of the electrical isolation elements 92 are. This enables switching loss of each switching elements 31 to 36 to be reduced as low as possible. In particular, if the inverter control apparatus 501 is applied to a hybrid vehicle, reducing switching loss of each switching elements 31 to 36 can lead to improvement of fuel economy of the hybrid vehicle and to conversation of the environment.

In addition, the switching speed setter 12 obtains information indicative of at least one of the switching-element current Ice, the environment temperature Ta, and the inverter input voltage Vinv in addition to information indicative of the atmospheric pressure Pa from a corresponding at least one of the measurement devices 86 (87), 62, and 24.

Then, the switching speed setter 12 sets the switching speed of each of the switching elements 31 to 36 so as to reduce the switching speed of each of the switching elements 31 to 36 with at least one of (1) An increase of the switching-element current Ice
(2) A decrease of the environment temperature Ta
(3) An increase of the inverter input voltage Vinv.

In other words, the switching speed setter 12 sets the switching speed of each of the switching elements 31 to 36 to an appropriate speed that satisfies the requirements of the atmospheric pressure Pa, and the requirements of at least one of the switching-element current Ice, environment temperature Ta, and inverter input voltage Vinv.

If the switching speed setter 12 failed to obtain the parameters Ice, Ta, and Vinv, it could be necessary to decide the maximum electrical isolation distance of each of the electrical isolation elements 92 mounted to the circuit board of the inverter control apparatus 501 such that the maximum electrical isolation distance prevents the occurrence of electrical breakdown of each of the electrical isolation elements 92 even if (1) The switching-element current Ice has an upper limit value
(2) The environment temperature Ta has a lower limit value
(3) The inverter input voltage Vinv has an upper limit value.

This therefore could cause the maximum electrical isolation distance to a longer value, and resulting in upsizing of the circuit board of the inverter control apparatus 501.

In contrast, the switching speed setter 12 according to the first embodiment obtains information indicative of at least one of the switching-element current Ice, the environment temperature Ta, and the inverter input voltage Vinv in addition to information indicative of the atmospheric pressure Pa from a corresponding at least one of the measurement devices 86 (87), 62, and 24. Then, the switching speed setter 12 adjusts the switching speed of each of the switching elements 31 to 36 in accordance with the pieces of information indicative of at least one of the switching-element current Ice, the environment temperature Ta, and the inverter input voltage Vinv. This enables the maximum electrical isolation distance of each of the electrical isolation elements 92 to be optimally determined.

The switching speed setter 12 according to the first embodiment is installed in the controller 101. The current-feedback control carried out by the controller 101 uses information indicative of the V- or W-phase current Iv or Iw as the switching-element current Ice and information indicative of the inverter input voltage Vinv. Thus, the switching speed setter 12 installed in the controller 101 enables the information indicative of the V- or W-phase current Iv or Iw as the switching-element current Ice and the information indicative of the inverter input voltage Vinv, which are input to the controller 101, to be easily used. Additionally, installing the switching speed setter 12 in the controller 101 enables a hardware and/or software logic circuit implementing the functions of the switching speed setter 12 to be relatively easily added to the base functions of the controller 101.

Second Embodiment

Figure 7:
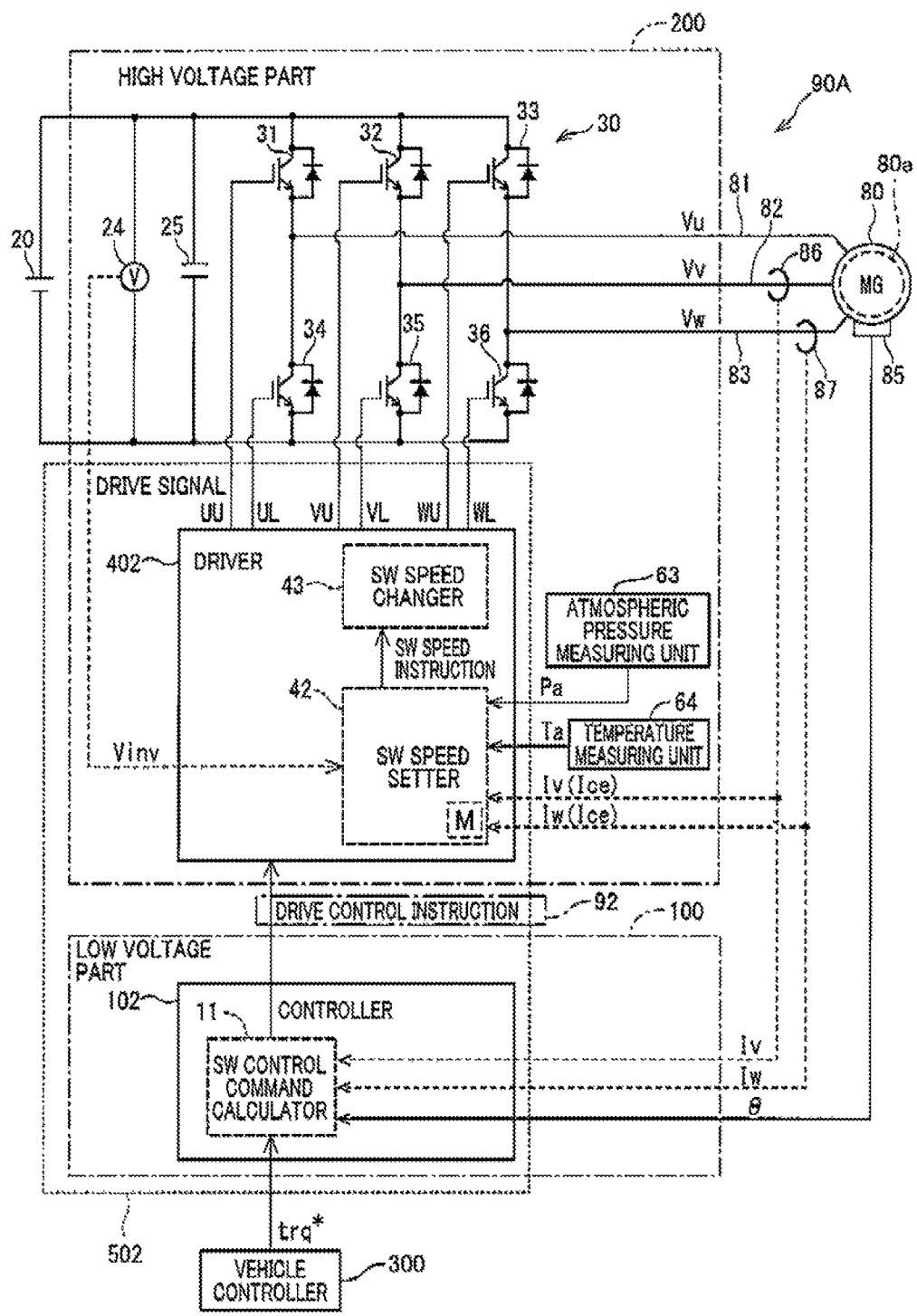
FIG. 7 is a circuit and block diagram of a power conversion system for converting input power to controlled output power according to the second embodiment of the present disclosure.

The following describes an inverter control apparatus 502 of a power conversion system 90A according to the second embodiment with reference to FIG. 7.

The structure and/or functions of the inverter control apparatus 502 according to the second embodiment are different from the inverter control apparatus 501 according to the first embodiment by the following points. So, the following mainly describes the different points.

The inverter control apparatus 502 includes a driver 402 located in the high voltage part 200. The driver 402 includes a switching speed setter 42. That is, a controller 102 according to the second embodiment, which is located in the low voltage part, includes the switching control command calculator 11 without including the switching speed setter 42.

Additionally, the power conversion system 90A includes an atmospheric-pressure measuring unit 63 for measuring atmospheric pressure Pa, and a temperature measuring unit 64 for measuring environment temperature Ta therearound. The atmospheric-pressure measuring unit 63 and temperature measuring unit 64 are provided in the high voltage part 200. The functions of each of the atmospheric-pressure measuring unit 63 and temperature measuring unit 64 are identical to those of a corresponding one of the atmospheric-pressure measuring unit 61 and temperature measuring unit 62.

The switching signal setter 42 obtains a value of the atmospheric pressure Pa from the atmospheric-pressure measuring unit 63, and a value of the environment temperature Ta from the temperature measuring unit 64.

The functions of the switching signal setter 42 are identical to those of the switching speed setter 12, so that the switching signal setter 42 outputs the switching speed instructions to the switching speed changer 43 inside the driver 402. The structure that the switching signal setter 42 is provided or installed in the driver 402 means that the switching signal setter 42 located in the high voltage part 200 enables the switching speed instructions to be input to the switching speed changer 43 without the switching speed instructions being input from the low voltage part 100 to the high voltage part 200 via the electrical isolation elements 92.

The atmospheric-pressure measuring unit 63 and temperature measuring unit 64 can be provided outside the driver 402 as illustrated in FIG. 7, or provided inside the driver 402. Like the switching speed setter 12, the switching signal setter 42 also obtains a value of the V-phase alternating current Iv or the W-phase alternating current Iw as a current reflecting the switching-element current Ice, and a value of the inverter input voltage Vinv in addition to the atmospheric pressure Pa and the environment temperature Ta. Then, the switching signal setter 42 executes the switching speed setting routine set forth above to set the switching speed of each of the switching elements 31 to 36 based on the value of at least one of these parameters Pa, Ice, Ta, and Vinv.

Like the first embodiment, the switching signal setter 42 can be designed to obtain at least one of the switching-element current Ice, the environment temperature Ta, and the inverter input voltage Vinv in addition to the atmospheric pressure Pa as the at least one parameter. Then, the signal setter 42 can be designed to set the switching speed of each of the switching elements 31 to 36 based on the atmospheric pressure Pa and at least one of the switching-element current Ice, the environment temperature Ta, and the inverter input voltage Vinv.

The switching speed setter 42 of the inverter control apparatus 502 adjusts the switching speed of each of the switching elements 31 to 36 with change of the atmospheric pressure Pa is, the lower the switching speed of each of the switching elements 31 to 36. This suppresses the magnitude of a surge even if the surge occurs in low atmospheric-pressure environments in which the withstand voltages, i.e. the electrical isolation margins, of the electrical isolation elements 92 may decrease. This reduces the electrical isolation distance of each of the electrical isolation elements 92 mounted to the circuit board of the inverter control apparatus 502, thus downsizing the circuit board of the inverter control apparatus 502.

The inverter control apparatus 502 eliminates the need to transmit the switching speed instructions from the low voltage part 100 to the high voltage part 200 via the electrical isolation elements 92. This makes it possible to eliminate the electrical isolation elements 92 from the power conversion system 90A.

Third Embodiment

Figure 8:
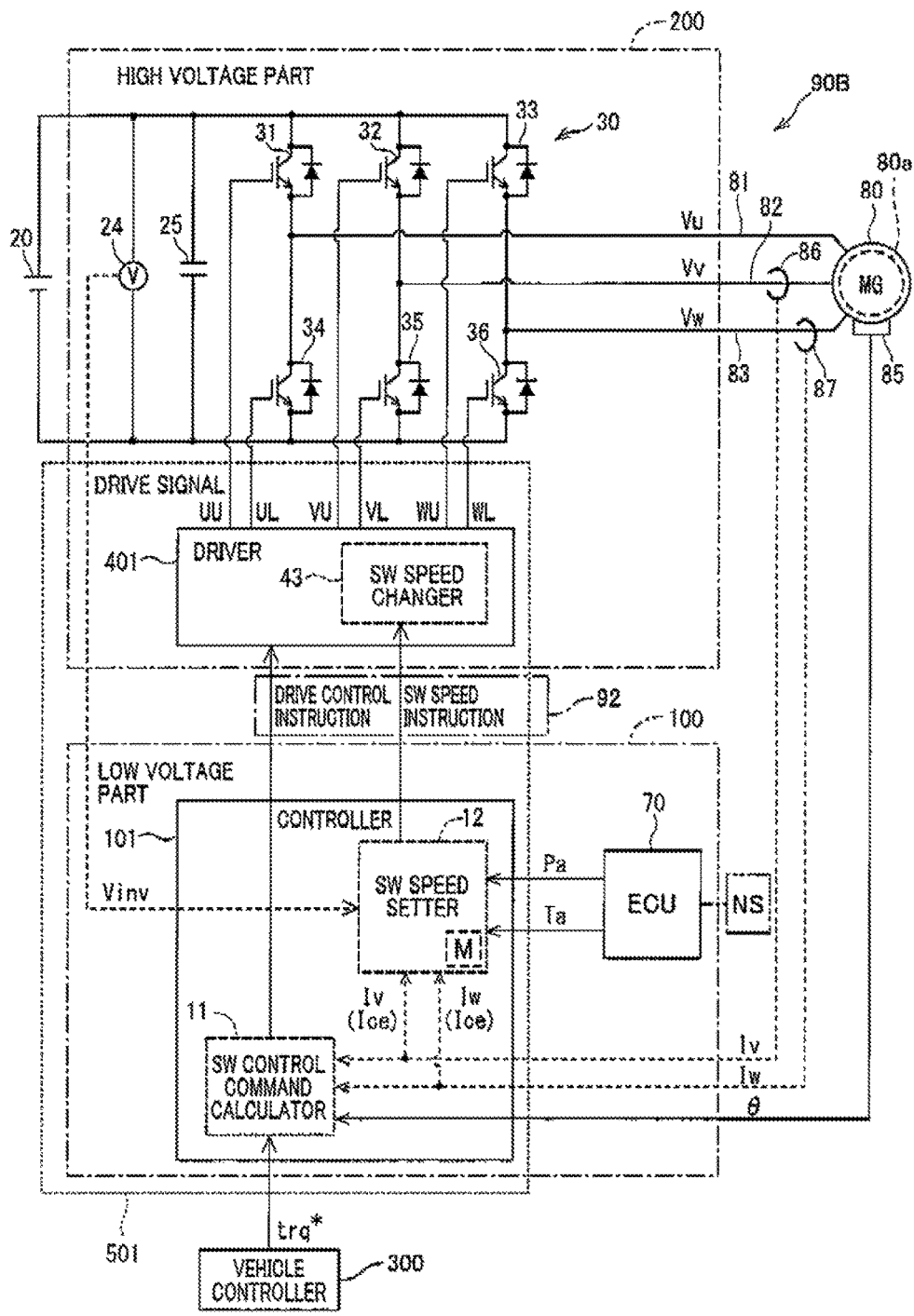
FIG. 8 is a circuit and block diagram of a power conversion system for converting input power to controlled output power according to the third embodiment of the present disclosure.

The following describes an inverter control apparatus 503 of a power conversion system 90B according to the third embodiment with reference to FIG. 8.

The structure and/or functions of the inverter control apparatus 503 according to the third embodiment are different from the inverter control apparatus 501 according to the first embodiment by the following points. So, the following mainly describes the different points.

Like the first embodiment, the switching speed setter 12 is installed in the controller 101. In particular, the switching speed setter 12 obtains a value of the atmospheric pressure Pa and a value of the environment temperature Ta from an electronic control unit (ECU) 70 whose functions are different from the functions of the controller 101.

One of ECUs installed in the vehicle, such as a battery ECU for controlling the state of charge (SOC) of the battery 20, allowable input power Win to the battery 20, and allowable output power from the battery 20, can be used as the ECU 70. The ECU 70 is configured to obtain a value of the atmospheric pressure Pa and a value of the environment temperature Ta for a predetermined purpose different from the switching-speed setting.

That is, the switching speed setter 12 is configured to obtain a value of the atmospheric pressure Pa from the ECU 70, and a value of the environment temperature Ta from the ECU 70.

The switching speed setter 12 also obtains a value of the V-phase alternating current Iv or the W-phase alternating current Iw as a current reflecting the switching-element current Ice, and a value of the inverter input voltage Vinv in addition to the atmospheric pressure Pa and the environment temperature Ta. Then, the switching speed setter 12 executes the switching speed setting routine set forth above to set the switching speed of each of the switching elements 31 to 36 based on the value of at least one of these parameters Pa, Ice, Ta, and Vinv.

Like the first embodiment, the switching speed setter 12 can be designed to obtain at least one of the switching-element current Ice, the environment temperature Ta, and the inverter input voltage Vinv in addition to the atmospheric pressure Pa as the at least one parameter. Then, the switching speed setter 12 can be designed to set the switching speed of each of the switching elements 31 to 36 based on the atmospheric pressure Pa and at least one of the switching-element current Ice, the environment temperature Ta, and the inverter input voltage Vinv.

The switching speed setter 12 can obtain, from another device, such as the ECU 70, information correlating with the atmospheric pressure Pa, and calculate a value of the atmospheric pressure Pa based on the obtained information.

For example, the switching speed setter 12 can obtain an attitude of the present place of the vehicle above sea level from a navigation system NS as another device. Then, the switching speed setter 12 can calculate the atmospheric pressure Pa as a function of the obtained attitude of the present place of the vehicle and the environmental temperature Ta.

The inverter control apparatus 503 according to the third embodiment achieves the same advantageous effects as the inverter control apparatus 501. Additionally, the inverter control apparatus 503 specifically obtains information correlating with the atmospheric pressure Pa from another device to set the switching speed of each switching element 31 to 36 accordingly. This achieves an advantageous effect of eliminating the dedicated atmospheric-pressure measuring unit 61.

Each of the inverter control apparatuses 501 to 503 aims to address reduction of the atmospheric pressure Pa around the corresponding inverter control apparatus due to when the vehicle is going to travel from a present place to a target place whose attitude above sea level is higher than that of the present place. In addition, abnormal weather or using each of the inverter control apparatuses 501 to 503 in an experimental installation can be considered as a possible cause of the reduction of the atmospheric pressure Pa each of the inverter control apparatuses 501 to 503.

The present disclosure is applied to cases where each of the inverter control apparatuses 501 to 503 reduces the switching speed of each switching element 31 to 36 in low atmospheric-pressure environments, whose atmospheric pressure is lower than 1 atmosphere. However, the present disclosure can be applied to other cases where each of the inverter control apparatuses 501 to 503 reduces the switching speed of each switching element 31 to 36 in low atmospheric-pressure environments, whose atmospheric pressure is higher than 1 atmosphere.

A booster converter, which boosts the voltage output from the battery 20 to thereby supplying the boosted voltage as the inverter input voltage Vinv to the inverter 30, can be provided between the battery 20 and the inverter 30.

Each of the inverter control apparatuses 501 to 503 can be applied to four- or more-phase inverters. The present disclosure can be applied to various converters except for the inverter for converting DC power to AC so power. For example, the present disclosure can be applied to an H bridge circuit for changing the direction and magnitude of a direct current of DC power.

Electrical loads, to which electrical power controlled by each of the control apparatuses 501 to 503, are not limited to the motor-generator 80, but can be applied to motors used for auxiliary devices for vehicles or used for alpine trains. Electrical devices used in experimental installations, around which the atmospheric pressure Pa changes, can be used as electrical loads of the control apparatuses 501 to 503.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An apparatus for controlling switching operations of a plurality of switching elements of a power converter to convert input power to output power, the apparatus comprising:
    a high voltage part and a low voltage part, the power converter being located in the high voltage part, the low voltage part being configured such that a voltage, which is lower than an input voltage of the input power to the power converter, is applied thereto:
    a drive controller configured to generate a drive control instruction indicative of predetermined switching operations of the switching elements;
    a driver configured to drive, in accordance with the drive control instruction, the switching elements, so that the switching elements perform the predetermined switching operations; and
    a switching speed setter provided in one of the high voltage part and the low voltage part and configured to:
        obtain at least information indicative of atmospheric pressure;
        set a switching-speed instruction indicative of adjustment of the switching speed of each of the switching elements such that the switching speed of the corresponding switching element decreases with a decrease of the atmospheric pressure; and
        output the switching-speed instruction; and
    a switching speed changer provided in the high voltage part and configured to change the switching speed of each of the switching elements in accordance with the switching-speed instruction output from the switching speed setter.

2. The apparatus according to claim 1, wherein the switching speed setter is configured to: obtain a switching-element current flowing through at least one of the switching element; and set the switching-speed instruction to adjust the switching speed of each of the switching elements such that the switching speed of the corresponding switching element decreases with an increase of the switching-element current.

3. The apparatus according to claim 1, wherein the switching speed setter is configured to: obtain an environmental temperature around the apparatus; and set the switching-speed instruction to adjust the switching speed of each of the switching elements such that the switching speed of the corresponding switching element decreases with a decrease of the environmental temperature.

4. The apparatus according to claim 1, wherein the switching speed setter is configured to: obtain the input voltage of the input power; and set the switching-speed instruction to adjust the switching speed of each of the switching elements such that the switching speed of the corresponding switching element decreases with an increase of the input voltage.

5. The apparatus according to claim 1, wherein the switching speed setter is configured to: obtain a switching-element current flowing through at least one of the switching element; obtain an environmental temperature around the apparatus; and obtain the input voltage of the input power, set the switching-speed instruction to adjust the switching speed of each of the switching elements based on correlation information representing that the switching speed of the corresponding switching element decreases with a decrease of the atmospheric pressure; and adjust the correlation information depending on: a first condition that the switching speed of the corresponding switching element decreases with an increase of the switching-element current; a second condition that the switching speed of the corresponding switching element decreases with a decrease of the environmental temperature; and a third condition that the switching speed of the corresponding switching element decreases with an increase of the input voltage.

6. The apparatus according to claim 1, wherein the switching speed setter is installed in the drive controller, and obtains the information indicative of the atmospheric pressure from one of an atmospheric pressure measuring unit and an external device, the atmospheric pressure measuring unit being provided in the low voltage part.

7. The apparatus according to claim 1, wherein the switching speed setter is installed in the driver, and obtains the information indicative of the atmospheric pressure from an atmospheric pressure measuring unit, the atmospheric pressure measuring unit being provided in the high voltage part.

8. The apparatus according to claim 1, wherein the apparatus and power converter are installed in a hybrid or electric vehicle in which a motor-generator is installed as a power source of the hybrid or electric vehicle, the predetermined switching operations of the switching elements controlling the output power to be supplied to the motor-generator.

* * * * *